(12) United States Patent
Guilvard et al.

(10) Patent No.: US 12,483,250 B2
(45) Date of Patent: Nov. 25, 2025

(54) MULTIPLYING DELAY LOCKED LOOP WITH HIGH TOLERANCE TO INPUT JITTER

(71) Applicant: Analog Devices International Unlimited Company, Limerick (IE)

(72) Inventors: Anthony Guilvard, Edinburgh (GB); Matt Felder, Breckenridge, CO (US)

(73) Assignee: Analog Devices International Unlimited Company, Limerick (IE)

( * ) Notice: Subject to any disclaimer, the term of this patent is extended or adjusted under 35 U.S.C. 154(b) by 105 days.

(21) Appl. No.: 18/584,479

(22) Filed: Feb. 22, 2024

(65) Prior Publication Data

US 2025/0274129 A1   Aug. 28, 2025

(51) Int. Cl.
*H03L 7/081* (2006.01)
*H03L 7/083* (2006.01)

(52) U.S. Cl.
CPC .......... *H03L 7/0816* (2013.01); *H03L 7/0818* (2013.01); *H03L 7/083* (2013.01)

(58) Field of Classification Search
CPC ................. H03L 7/0812–0818; H03L 7/083
See application file for complete search history.

(56) References Cited

U.S. PATENT DOCUMENTS

| | | | |
|---|---|---|---|
| 9,553,593 B1* | 1/2017 | Weng | H03L 7/07 |
| 2015/0061787 A1* | 3/2015 | Lin | H03L 7/104 |
| | | | 331/36 R |
| 2015/0221285 A1* | 8/2015 | Song | H03L 7/0995 |
| | | | 345/82 |
| 2019/0348988 A1* | 11/2019 | Kim | H03L 7/0998 |

* cited by examiner

*Primary Examiner* — Patrick O Neill
(74) *Attorney, Agent, or Firm* — ArentFox Schiff LLP

(57) ABSTRACT

In an aspect, a clock generation system includes a pulse filter configured to receive an input reference clock signal and a multiplied input reference clock signal and filter the multiplied input reference clock signal to generate an output reference clock signal with reduced negative period jitter with respect to the input reference clock signal by selectively skipping clock cycles of the multiplied input reference clock signal corresponding to input reference clock signal edges.

23 Claims, 10 Drawing Sheets

MULTIPLYING DELAY LOCKED LOOP WITH HIGH TOLERANCE TO INPUT JITTER

TECHNICAL FIELD

Aspects of the present disclosure relate generally to multiplying delay locked loops (MDLLs) and, more particularly, to MDLLs with high tolerance to input jitter.

BACKGROUND

In audio applications, an audio digital to analog converter (DAC) may be quite tolerant of high-frequency time interval error (TIE) jitter (that is, jitter above the audio band), but should also be tolerant of low-frequency TIE jitter. Time Interval Error (TIE) is the difference between observed clock edge time and expected clock edge time for each clock edge present. It is measured by subtracting the actual clock edge from the ideal clock edge. Audio listeners may highly value the ability to tolerate very high levels of input jitter with no degradation in audio quality. Such an ability saves the need for a clean master-clock and avoids the need for an extra crystal oscillator reference in the applications.

Multiplying delay locked loops (MDLLS) have known size, power, simplicity, and jitter advantages over phased locked loops (PLLs), but suffer from a lack of input jitter filtering which limits their usefulness in many applications including audio applications. Known approaches using an MDLL frequency reference suffer from the drawback in that when there is high input jitter it can cause the digital (central processing unit (CPU)) clock cycle time to be substantially shorter (CPU period jitter issue, not converter TIE jitter issue). This substantially shorter digital (CPU) clock cycle time caused difficulties meeting timing margins at higher CPU clock frequencies. The lack of input jitter filtering is only a problem for the CPU clock and not for the audio DAC since the CPU is more sensitive to jitter than the DAC. Hence, there is a need for an improved multiplying delay locked loop with high tolerance to input jitter, particular low-frequency jitter, relating to the CPU clock.

SUMMARY

The following presents a simplified summary of one or more aspects to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

In accordance with aspects of the present disclosure, a reference clock generation system is provided. The reference clock generation system includes a pulse filter configured to receive an input reference clock signal and a multiplied input reference clock signal and filter the multiplied input reference clock signal to generate an output reference clock signal with reduced negative period jitter with respect to the input reference clock signal by selectively skipping clock cycles of the multiplied input reference clock signal corresponding to input reference clock signal edges.

In accordance with other aspects of the present disclosure, a reference clock circuit is provided. The reference clock circuit includes a multiplying delay locked loop (MDLL) configured to generate a multiplied reference clock signal based on an input reference clock signal. The reference clock circuit further includes a pulse filter configured to receive the input reference clock signal and the multiplied input reference clock signal and filter the multiplied input reference clock signal to generate an output reference clock signal with reduced negative period jitter with respect to the input reference clock signal by selectively skipping clock cycles of the multiplied input reference clock signal corresponding to input reference clock signal edges.

In accordance with still other aspects of the present disclosure, a method for reference clock generation is provided. The method includes receiving, at a pulse filter, an input reference clock signal and a multiplied input reference clock signal. The method further includes filtering, by the pulse filter, the multiplied input reference clock signal to generate an output reference clock signal with reduced negative period jitter with respect to the input reference clock signal by selectively skipping clock cycles of the multiplied input reference clock signal corresponding to input reference clock signal edges To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
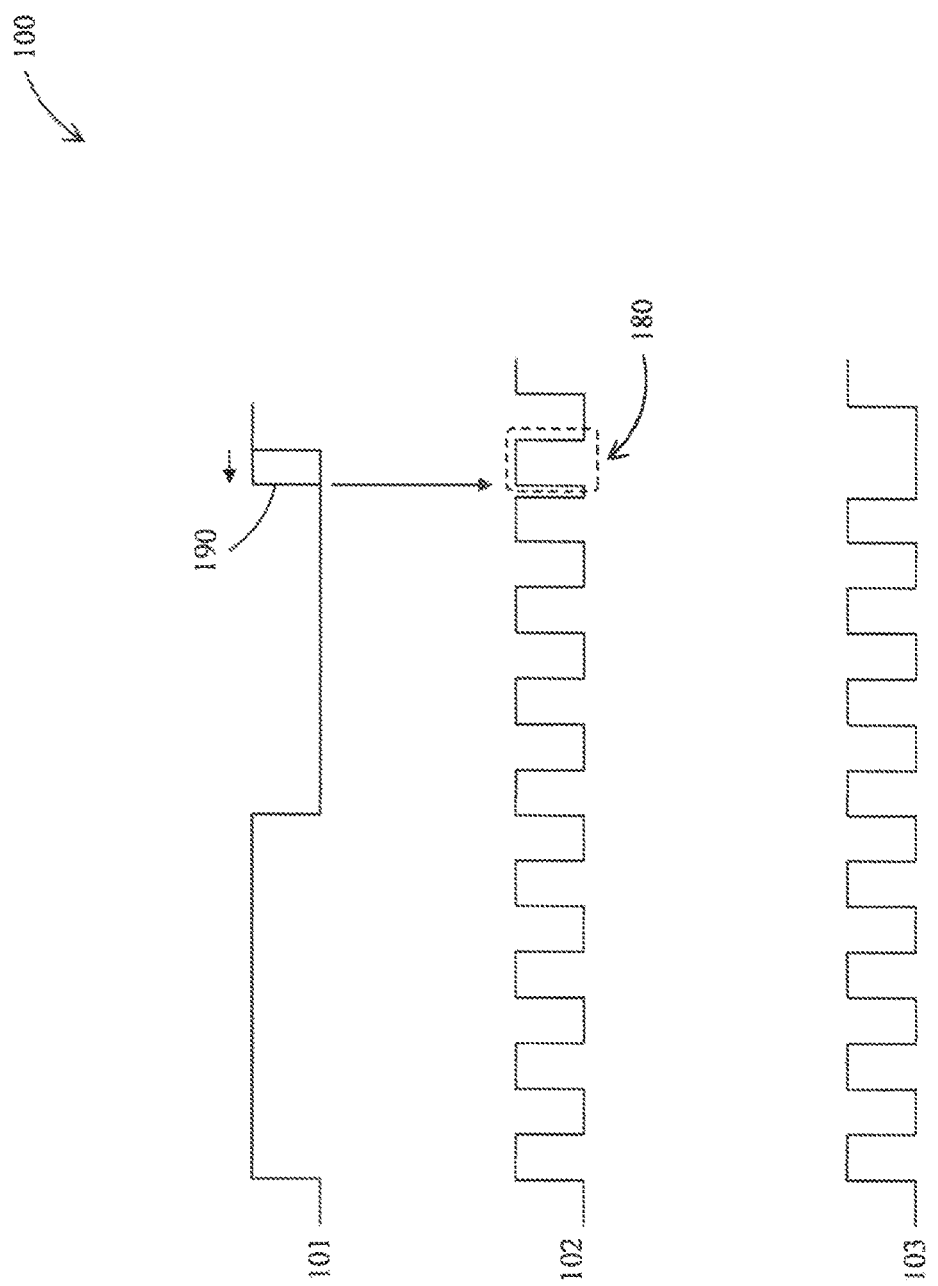
FIG. 1 is a diagram of an example input reference clock signal, an 8× multiplying delayed locked loop (MDLL) reference clock signal, and a 7×MDLL reference clock signal, in accordance with an exemplary aspect.

The present disclosure is directed to multiplying delay locked loops (MDLLS) with high tolerance to input jitter such as, but not limited to, time interval error (TIE) jitter. Jitter can be any deviation in, or displacement of, signal pulses in a high-frequency digital signal. The deviation can be in terms of phase timing or the width of the signal pulse. Here, aspects of the present disclosure are directed to deviations in both phase timing and signal pulse width since a change in phase timing typically results in a change in the signal pulse width and vice versa.

Compared to phased locked loops (PLLs), conventional MDLLs offer simplicity, low self-jitter, low power, and low area, but conventional MDLLs also have no filtering of input jitter. This lack of filtering can cause the worst-case output clock period to be too fast for many applications when the input jitter is high. Addressing this limitation for conventional MDLL's can make them more attractive than a PLL for some clock generation applications In an aspect, a conventional MDLL is combined with a synchronized pulse filter to form a MDLL circuit that eliminates/ignores the potentially short output cycle times that occur if a reference clock edge arrives early (e.g., arrives with high input jitter). As used herein, the "pulse filter" selectively removes/deletes/swallows specific pulses of the clock.

When a reference edge arrives early, a result can be a very short low time in a central processing unit (CPU) cycle where the overall CPU cycle time is nearly half resulting in a shorter than expected and/or required processing cycle which could result in clock-based errors. In an aspect, the last MDLL clock (prior to the reference edge) is skipped to eliminate the potential short CPU cycle time.

In an aspect, a MDLL circuit adds a pulse filter to a MDLL, and phase aligns the pulse filter with an input reference clock. The potentially noisy edges of the input reference clock are skipped at the MDLL circuit output so that the MDLL circuit never outputs a short CPU cycle time even in the presence of really high input jitter. This pulse skipping is outside of the MDLL circuit control loop so the pulse skipping does not introduce noise inside the MDLL circuit control loop. Ultimately, the MDLL circuit of the disclosure allows a smaller, lower-power, and improved minimum CPU cycle-time frequency reference. These and other attendant advantages are readily determined by one of skill in the art given the teachings of the present disclosure provided herein.

Unlike a PLL or frequency locked loop (FLL), a MDLL resets accumulated/integrated jitter at each input reference edge. This results in a very low contribution of jitter from the variable controlled oscillator (VCO) and most of that jitter is "lumped" into the reference edges which the pulse filter will absorb.

The pulse filter adds positive period jitter, but this does not matter for the digital clock because this jitter only makes the cycle time longer, and not shorter as suffered with simply a conventional MDLL with high input jitter.

The pulse filter not only eliminates the negative period jitter from the input reference edge, but also eliminates the integrated (delay line) jitter that has accumulated between reference clock edges.

The pulse skipping creates high frequency TIE jitter (at reference frequency multiples). This is somewhat similar to a Sigma Delta in that the pulse skipping pushes the jitter (noise) from a band that matters to a band that does not matter. Accordingly, aspects of the present disclosure may be used in any electronic implementations involving clock usage and especially clock generation in the presence of periodic jitter from any cause.

Referring to FIG. 1, an example input reference clock signal 101, an 8×MDLL reference clock signal 102, and a 7×MDLL reference clock signal 103 are shown, in accordance with an exemplary aspect.

In an aspect, input reference clock signal 101 may be generated from any of a crystal oscillator reference, an I2S digital audio clock, or from a phase locked loop (PLL) with a voltage controlled oscillator (VCO). In other aspects, other devices may be used to generate the input reference clock signal.

When a reference edge 190 arrives early, a result can be a very short low time in a central processing unit (CPU) cycle where the overall CPU cycle time is nearly half. In an aspect, the first MDLL clock cycle 180 (created by the reference edge 190) of the 8×MDLL reference clock 102 is skipped to eliminate the potential short CPU cycle time. In this way, the overall cycle time is increased and the decrease is thus addressed and overcome.

It is to be appreciated that aspects of the present disclosure are not limited to the clocks signals shown herein. For example, in other aspects, the clock signals may be inverted from what is shown in FIG. 1. In such a case, an early reference pulse could cause a short high time rather than a short low time, a situation that is addressed by the pulse skipping described in the present disclosure.

Figure 2:
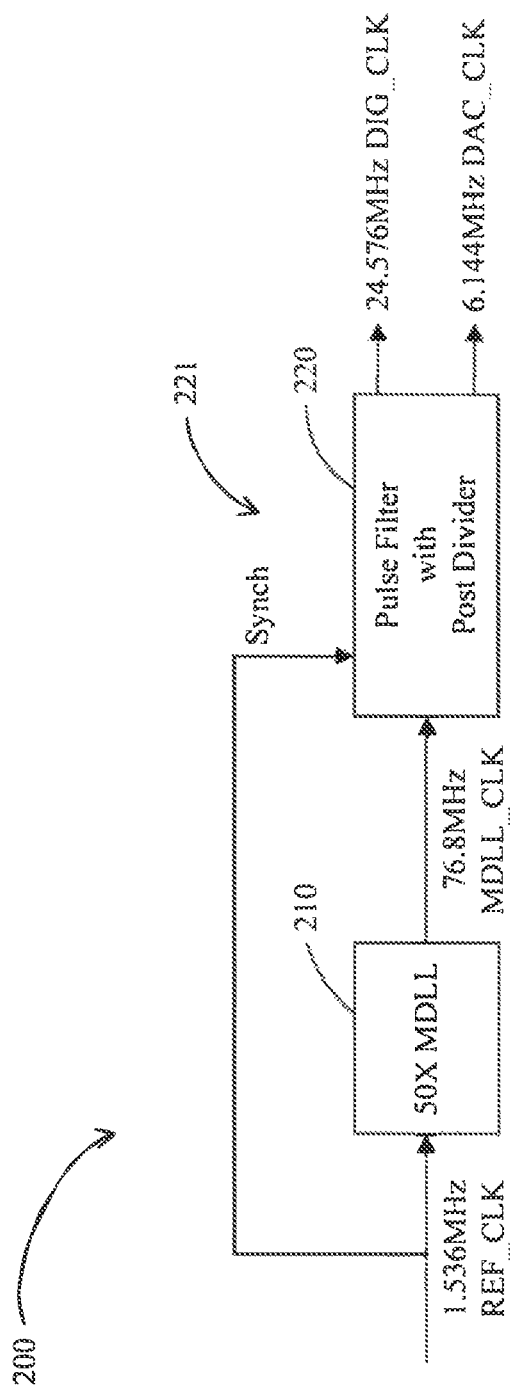
FIG. 2 is a diagram of an example MDLL circuit, in accordance with an exemplary aspect.

Referring to FIG. 2, an example multiplying delayed locked loop (MDLL) circuit 200 is shown, in accordance with an exemplary aspect.

The MDLL circuit 200 includes a MDLL 210 and a pulse filter 221 with post-divider 220.

In the example of FIG. 2, the input to the MDLL 210 is an input reference clock signal, also interchangeably referred to as "B_CLK" or "base clock". Further, in the example, the MDLL 210 has a 50× multiplication rate that it applies to the input reference clock signal. Of course, other multiplication rates can be used. Also, the input reference clock signal has a frequency of 1.536 MHz. Accordingly, the multiplied reference clock signal output from the 50× MDLL has a frequency of 76.8 MHz. In an aspect, B_CLK may be the base clock used to determine frequencies of a CPU(s), a memory(s), and so forth of a computer processing system such as, for example, but not limited to, an audio, video, or multimedia processing system.

In the example of FIG. 2, the post divider 220 operates at respective dividing rates of 3 and 12 for outputs from the divider of 24.576 MHz DIG_CLK and 6.144 MHz DAC_CLK, respectively. As used herein, "DIG_CLK" refers to the clock signal that drives a CPU, and "DAC_CLK" refers to the clock signal that drives a digital-to-analog converter (DAC). In an aspect, the DAC is used to drive one or more speakers or other types of sound reproduction devices. It is to be appreciated that a given computer processing system may have multiple CPUs and/or memories not necessarily operating at the same frequency but instead using different frequencies. Aspects of the present disclosure may be applied in any of these circumstances.

To summarize:
B_CLK=1.536 MHz;
MDLL multiplication factor=50×;
MDLL output=76.8 MHz;
Pulse filter output=73.728 MHz
Post Divider divide by 3 output=24.576 MHz DIG_CLK; and
Post Divider divide by 12 output=6.144 MHz DAC_CLK.

When not using cycle skipping (pulse filtering), a common choice is to use an MDLL multiplier of 48 to get a 73.728 Mhz clock signal. Then a division by 3=24.576 Mhz and a division by 12=6.144 Mhz. When the pulse filter 221 is used, we run at the higher 76.8 Mhz to allow for the dropped cycles.

Figure 3:
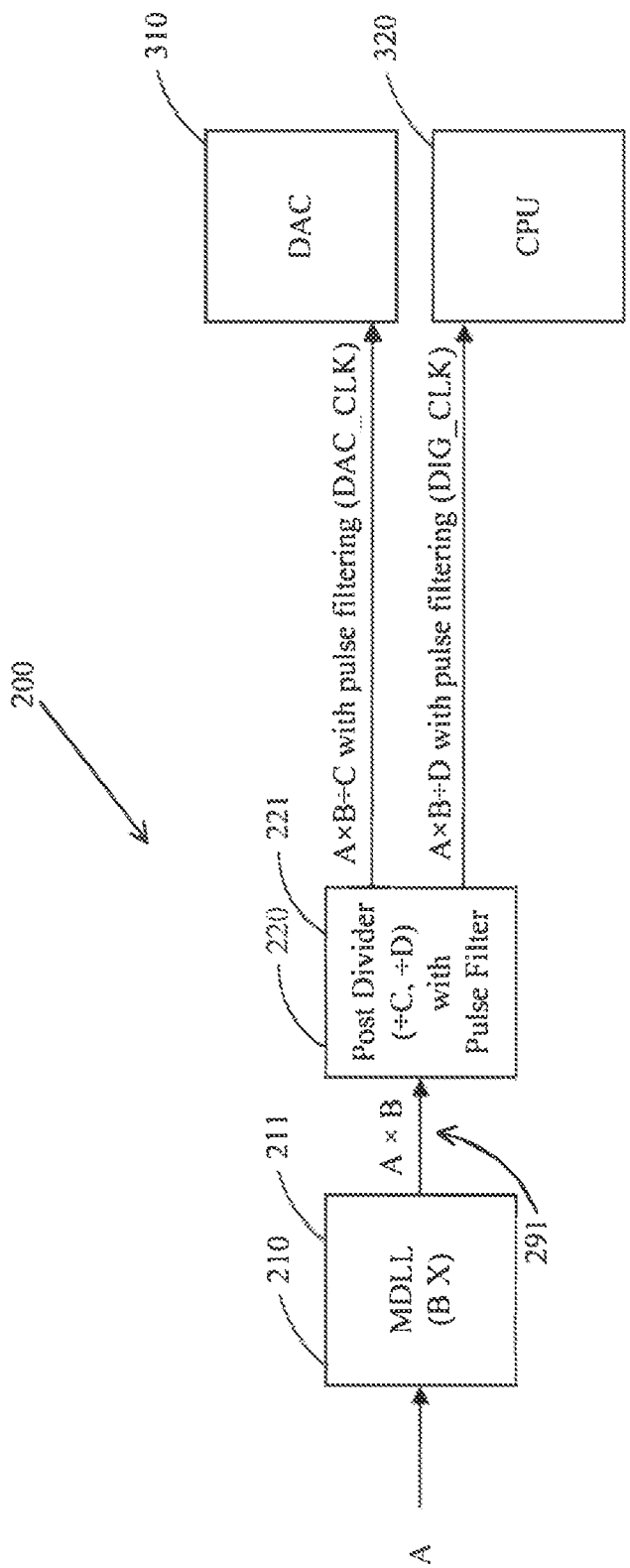
FIG. 3 is a further diagram of the example MDLL circuit of FIG. 2, in accordance with an exemplary aspect.

Referring to FIG. 3, the example multiplying delayed locked loop (MDLL) circuit 200 of FIG. 2 is further shown, in accordance with an exemplary aspect.

In the example of FIG. 3, the MDLL circuit 200 is connected to a digital-to-analog converter (DAC) 310 that is, in turn, connected to one or more speakers (not shown). In particular, the DAC 310 is configured to receive DAC_CLK from the MDLL circuit 200 through the post divider 220.

Further, in the example of FIG. 3, the MDLL circuit 200 is connected to a central processing unit (CPU) 320. The MDLL 221 includes a frequency multiplier circuit 211. In particular, the CPU 320 is configured to receive DIG_CLK from the MDLL circuit 200.

In an aspect, the following applies:
B_CLK frequency=variable A;
MDLL 210 multiplication factor=variable B;
Post divider 220 respective dividing rates=C (DIG_CLK) and D (DAC_CLK.
In view of the preceding, the following applies:
the multiplied input reference clock signal 291=A×B;

$$DAC\_CLK = A \times B/C;\text{ and}$$

$$DIG\_CLK = A \times B/D.$$

The post divider 220 employs early reference edge detection 190 and pulse filtering 221 as described herein.

In an aspect, "early reference edge detection" refers to the process of detecting a reference edge output from a MDLL 210 that arrives earlier than an expected edge arrival time (hereinafter interchangeably referred to as "early edge"), coinciding with having a shorter pulse for the negative portion of a corresponding cycle having the early edge.

In an aspect, "pulse filtering" refers to the process of removing a negative pulse from a cycle including a positive pulse and a negative pulse when that negative pulse arrives earlier than expected. The early edge typically results from jitter, which the pulse filtering is configured to address. The pulse filtering may elongate the positive cycle time due to the addition to two consecutive positive pulses resulting from the removal of the negative intervening pulse, but this elongated positive cycle time does not adversely affect CPU operation. Similarly, "pulse filtering" refers to the process of removing a positive pulse from a cycle including a positive pulse and a negative pulse when that positive pulse arrives earlier than expected. Such positive pulse filtering may similarly elongate the negative cycle time, but this elongated negative cycle time does not adversely affect CPU operation. In both negative and positive pulse filtering, the corresponding elongation does not adversely CPU time because a longer CPU time still affords sufficient time for an expected process to be performed unlike a shorter CPU time.

In an aspect, as shown, the pulse filter 221 is included in the post divider 220, which is a post-multiplication divider. In other aspects, the pulse filter 221 and the post divider 220 are separate elements. In other aspects, an input(s) of the pulse filter 221 is connected to an output(s) of the post divider 220 in order to filter representations of the input reference clock signal B_CLK that have been multiplied by a multiplication factor (by the MDLL 210) and divided by a dividing factor C, D (by the post divider 220) in order to generate a signal of a particular frequency for a particular application (e.g., DAC, CPU, etc.). In yet other aspects, the post divider 220 is omitted, and the pulse filter 221 is configured to directly operate on the undivided output from the MDLL 210. For the sake of illustration, the pulse filter 221 is considered its own entity configured to perform a particular set of functions (e.g., pulse filtering and early reference edge detection), whether implemented separately from or within another element.

Figure 4:
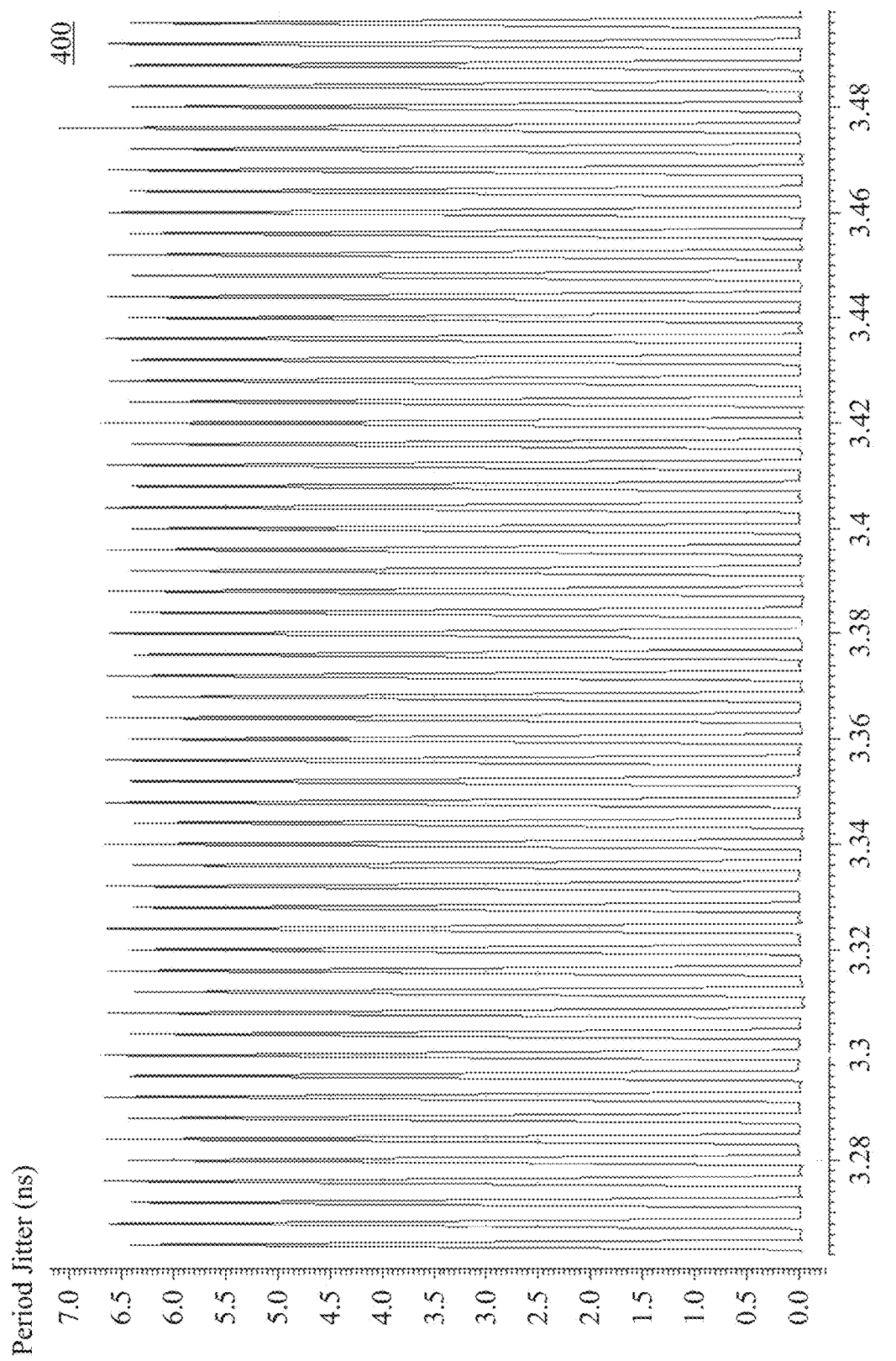
FIG. 4 is an example plot of period jitter for a 24.576 MHz DIG_CLK with pulse filtering with reference to an input reference clock signal B_BLOCK, in accordance with an exemplary aspect.

Referring to FIG. 4, an example plot 400 of period jitter for a 24.576 MHz DIG_CLK with pulse filtering is shown, in accordance with an exemplary aspect.

In the example of FIG. 4, a 256 KHz B_BLK is used with transient noise as shown. The plotted period jitter it relative to a 76.8 MHz/3=25.6 MHz clock period.

It is to be noted that the process of pulse filtering as described herein may result in large jitter in the filtered DIG_CLK that is limited to positive period jitter (extra cycle time). There is very little negative jitter to shorten the cycle time of DIG_CLK.

For example, it is to be further noted that the root mean square (RMS) of all jitter 400 after pulse filtering is 3.3 ns, while the RMS of negative jitter after pulse filtering is 8.6 ps. In this example, the 6.5 ns of positive jitter comes from periodically dropping half a cycle of 76.8 MHz (0.5/76.8 Mhz=6.5 ns). Dropping the correct cycles makes the effective divider 3.125 so that 76.8 Mhz/3.125=24.576 MHz.

Figure 5:
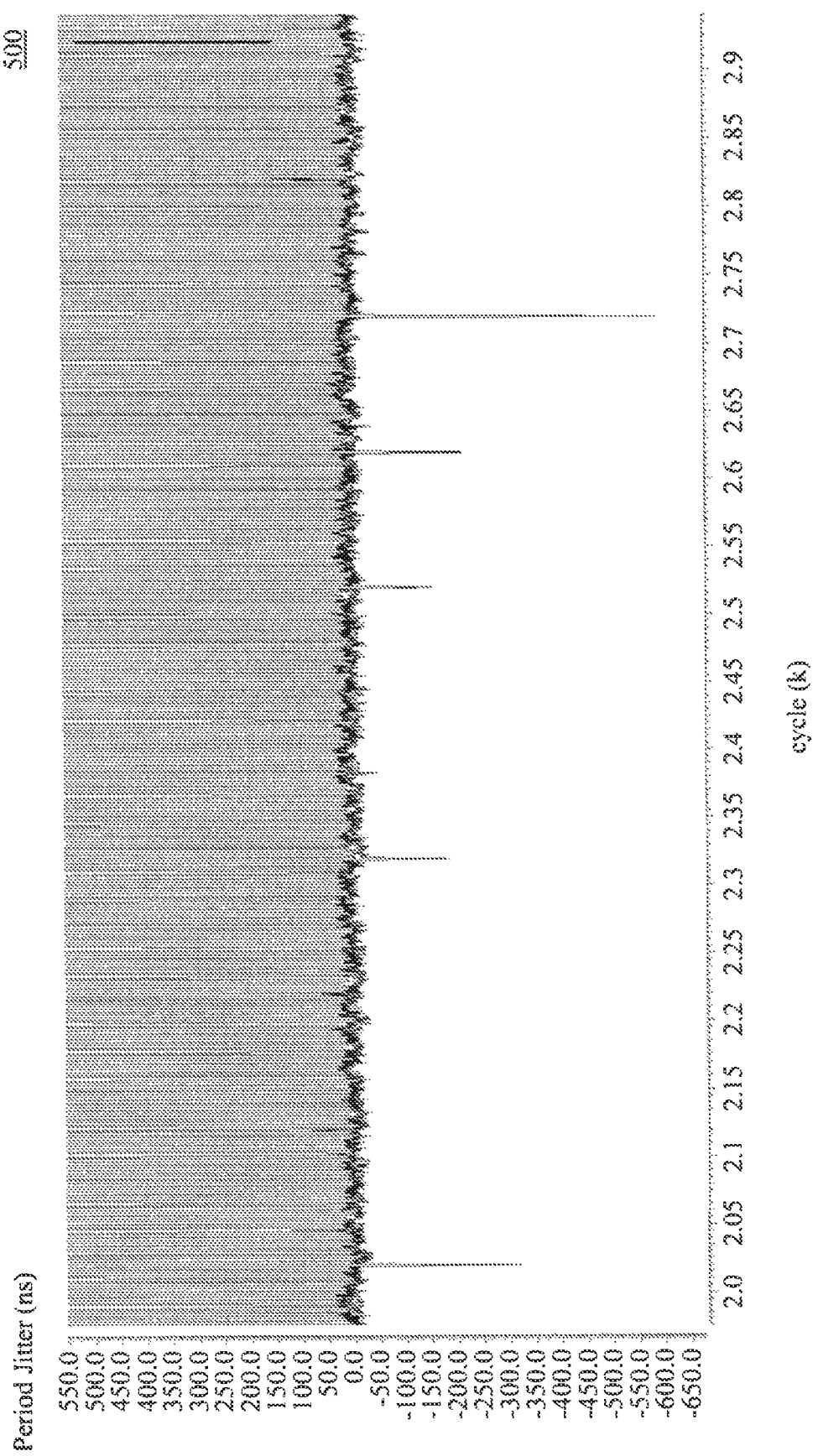
FIG. 5 is an example plot of a 24.576 MHz DIG_CLK with pulse filtering and a 25.6 MHz DIG_CLK without pulse filtering, in accordance with an exemplary aspect.

Referring to FIG. 5, an example plot 500 of a 24.576 MHz DIG_CLK (lightweight line) with pulse filtering and a 25.6 MHz DIG_CLK (heavyweight line) without pulse filtering is shown, in accordance with an exemplary aspect.

In particular, the lightweight line shows negative jitter in a 24.576 MHz DIG_CLK with pulse filtering. The pulse filtering eliminates the large negative jitter spikes from the reference clock (B_CLK) edge.

The heavyweight line (along the lower portion of the plot 500) shows a 25.6 MHz DAC_CLK without pulse filtering. The lack of pulse filtering results in positive and negative spikes (jitter) at various edges.

Dropping pulses reduces the frequency from 25.6 Mhz to 24.476 Mhz because the clock edges are getting removed. It is like a very noisy fractional frequency divider. In the process of dropping these pulses, the undesired negative period jitter is being removed in favor of positive period jitter that will not cause a timing error for the CPU.

In the example of FIG. 5, the input reference clock signal B_CLK has a frequency of 256 KHz and the MDLL multiplication factor is 300, and the DIG_CLK divider is 3, resulting in an unfiltered DIG_CLK with a frequency of 25.6 MHz.

Figure 6:
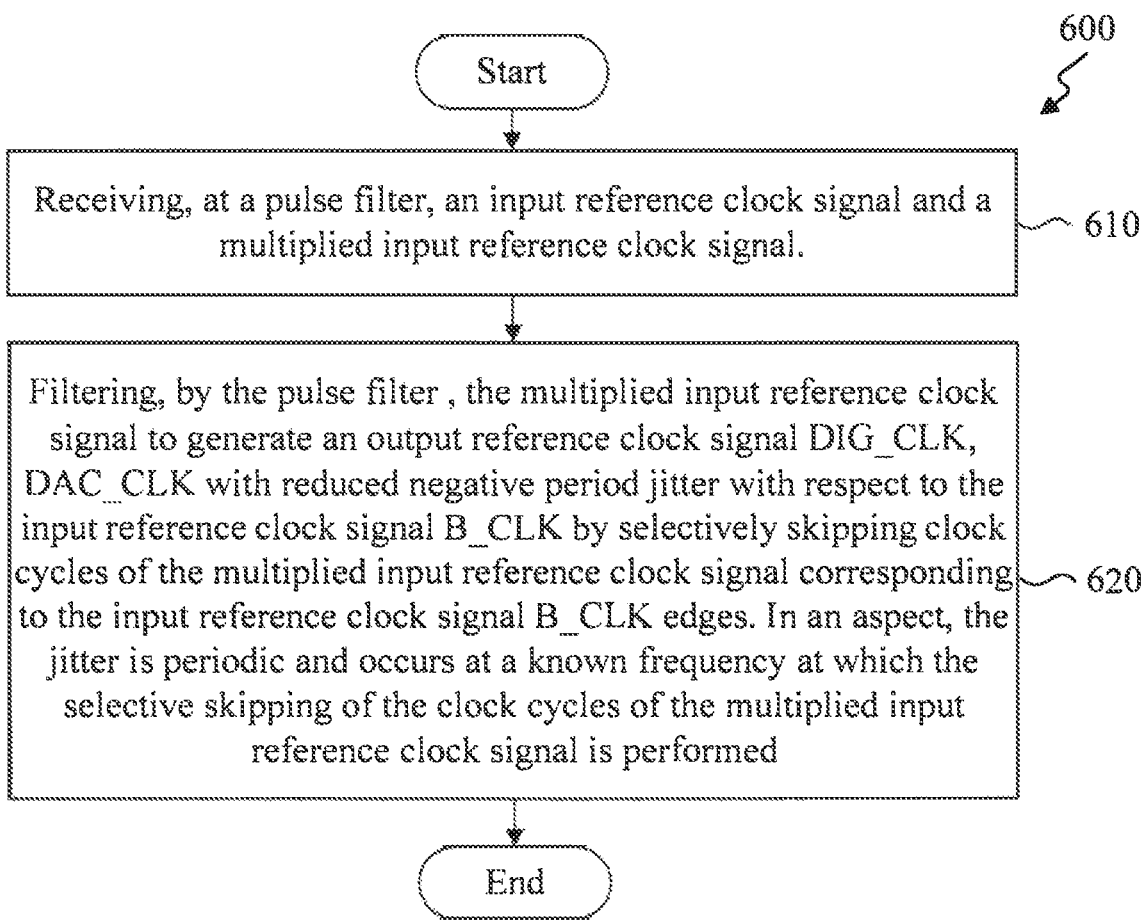
FIG. 6 is a flowchart of an example method for reference clock generation, in accordance with an exemplary aspect.

Referring to FIG. 6, an example method 600 for reference clock generation is shown, in accordance with an exemplary aspect.

At block 610, the method 600 includes receiving, at a pulse filter 221, an input reference clock signal B_CLK and a multiplied input reference clock signal 291.

At block 620, the method 600 includes filtering, by the pulse filter 221, the multiplied input reference clock signal 291 to generate an output reference clock signal DIG_CLK, DAC_CLK with reduced negative period jitter with respect to the input reference clock signal B_CLK by selectively skipping clock cycles of the multiplied input reference clock signal 291 corresponding to the input reference clock signal B_CLK edges. In an aspect, the jitter is periodic and occurs at a known frequency at which the selective skipping of the clock cycles of the multiplied input reference clock signal 291 is performed. For example, in an aspect, jitter may be initially estimated and addressed. In an aspect, the error may be automatically adjusted via a feedback and error measurement approach that automatically determine parameters (frequency, amplitude, sign, etc.) of the detected jitter for use adjusting parameters of the pulse filtering described herein. In an aspect, jitter may be measured by a measurement device such as, but not limited to, an oscilloscope.

In an aspect, a neural network (NN) (e.g., such as, but not limited to, a convolutional neural network (CNN)) as used in image processing may be used to evaluate a base clock B_CLK to determine the jitter therein. In an aspect, a NN may be used to evaluate any of the clock signals from B_CLK to DAC_CLK or DIG_CLK, including intermediate clock signals such as 291 or a post-divided signal. For example, in an aspect, an image of a current clock signal (over a certain time period) being evaluated is compared to an ideal and/or expected clock signal (over the same or a similar time period) to determine any deviation (e.g., error) therebetween. The ideal and/or expected clock signal may be stored in a library of ideal and/or expected clock signals that are pre-mapped or dynamically mapped to various corrective behaviors (e.g., frequency adjustments in the synchronization between B_CLK and DAC_CLK and/or DIG_CLK maintained by the pulse filter 221) in order to ensure optimal pulse filtering as described herein.

In this way, the periodic nature of the jitter may be determined and specifically addressed (synchronized to) in order to eliminate the negative pulse jitter as described herein.

Figure 7:
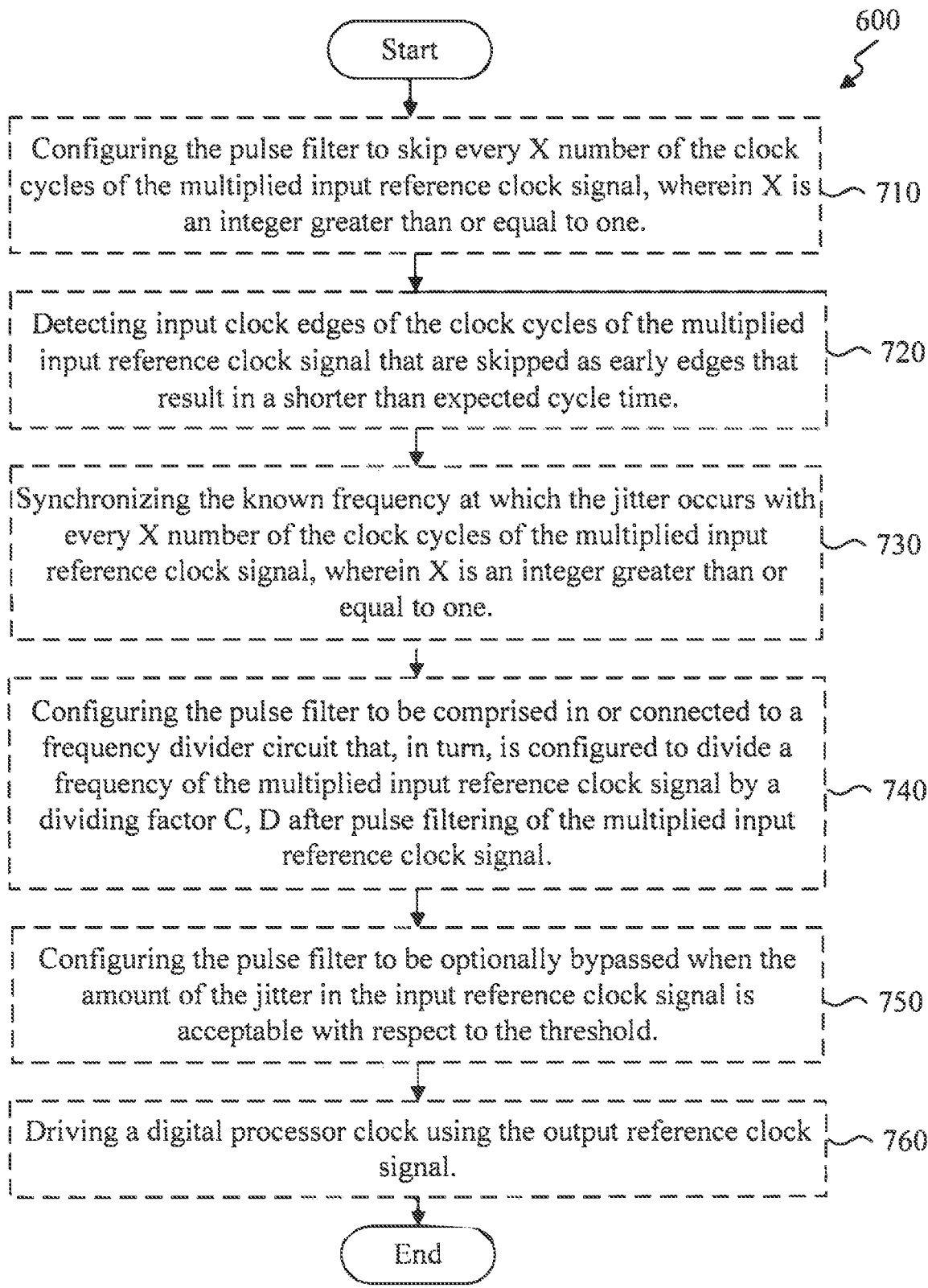
FIG. 7 is a flowchart of further example steps of the method of FIG. 6, in accordance with an exemplary aspect.

Referring to FIG. 7, further example steps of the method of 600 of FIG. 6 are shown, in accordance with an exemplary aspect.

At block 710, the method 600 includes configuring the pulse filter 221 to skip every X number of the clock cycles of the multiplied input reference clock signal 291, wherein X is an integer greater than or equal to one.

At block 720, the method 600 includes detecting input clock edges of the clock cycles of the multiplied input reference clock signal 291 that are skipped as early edges that result in a shorter than expected cycle time.

At block 730, the method 600 includes synchronizing the known frequency at which the jitter occurs with every X number of the clock cycles of the multiplied input reference clock signal 291, wherein X is an integer greater than or equal to one.

At block 740, the method 600 includes configuring the pulse filter 221 to be comprised in or connected to a frequency divider circuit 220 that, in turn, is configured to divide a frequency of the multiplied input reference clock signal 291 by a dividing factor C, D after pulse filtering of the multiplied input reference clock signal 291. Technically, pulses can be filtered before or after the divider 220. However, it is usually preferable to filter on the higher frequency clock before the divider 220 as it gives more resolution.

At block 750, the method 600 includes configuring the pulse filter 221 to be optionally bypassed when the amount of the jitter in the input reference clock signal B_CLK is acceptable with respect to the threshold.

At block 760, the method 600 includes driving a digital processor 320 using the output reference clock signal DIG_CLK.

Figure 8:
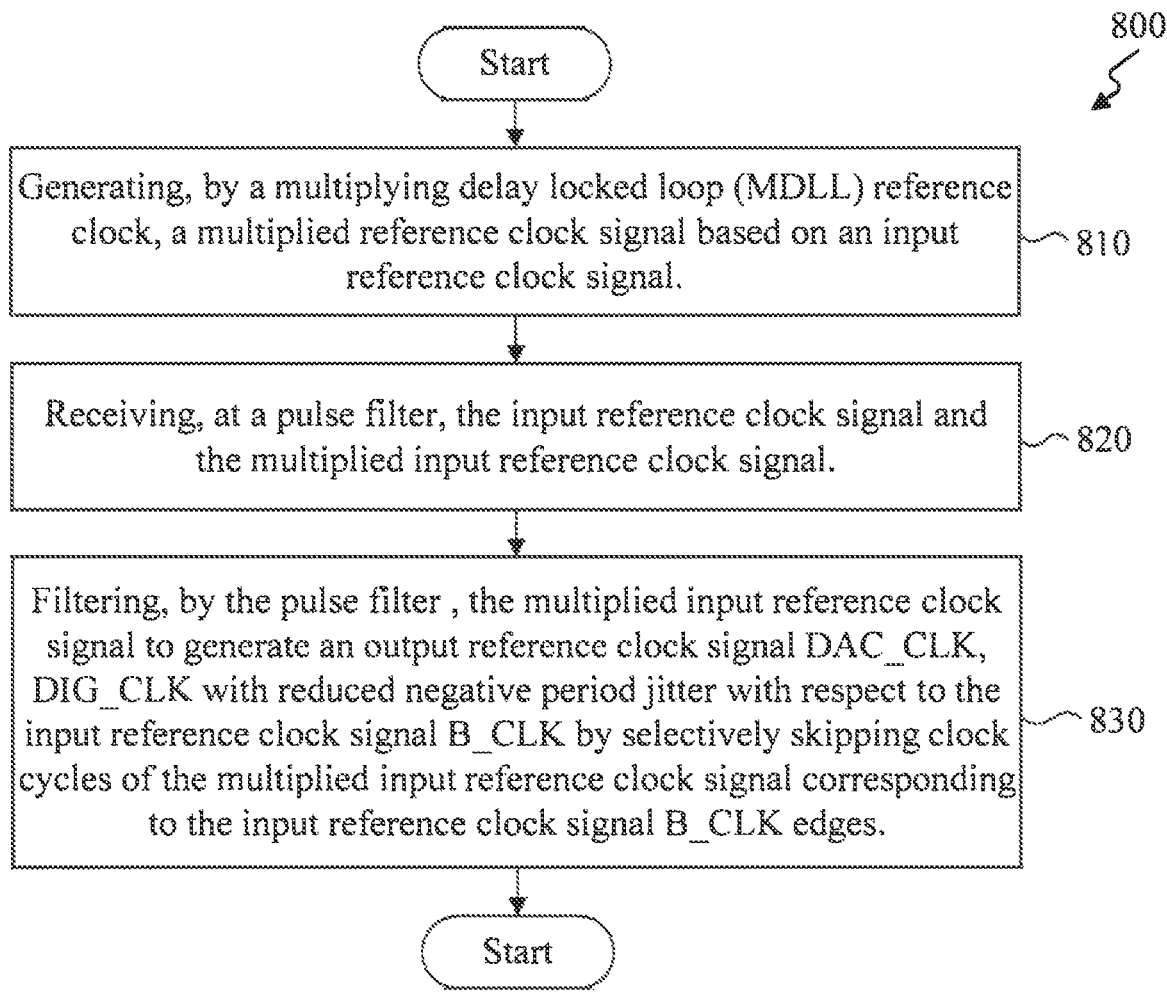
FIG. 8 is a flowchart of another example method for reference clock generation, in accordance with an exemplary aspect.

Referring to FIG. 8, another example method 800 for reference clock generation is shown, in accordance with an exemplary aspect.

At block 810, the method 800 includes generating, by a multiplying delay locked loop (MDLL) 210, a multiplied reference clock signal 291 based on an input reference clock signal B_CLK.

At block 820, the method 800 includes receiving, at a pulse filter 221, the input reference clock signal B_CLK and the multiplied input reference clock signal 291.

At block 830, the method 800 includes filtering, by the pulse filter 221, the multiplied input reference clock signal 291 to generate an output reference clock signal DAC_CLK, DIG_CLK with reduced negative period jitter with respect to the input reference clock signal B_CLK by selectively skipping clock cycles of the multiplied input reference clock signal 291 corresponding to the input reference clock signal B_CLK edges.

Figure 9:
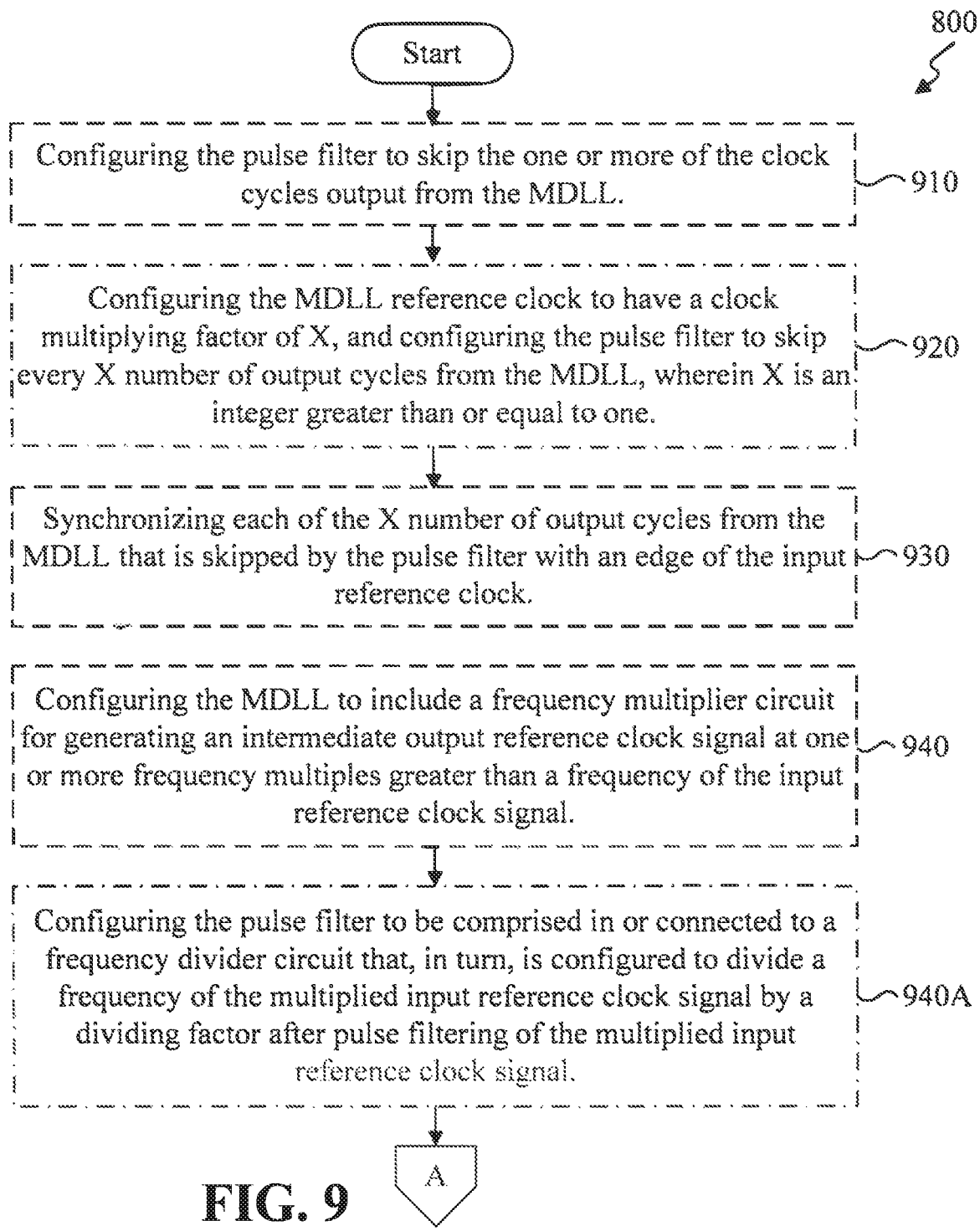
FIGS. 9-10 are flowcharts of further example steps of the method of FIG. 8, in accordance with an exemplary aspect.
Figure 10:
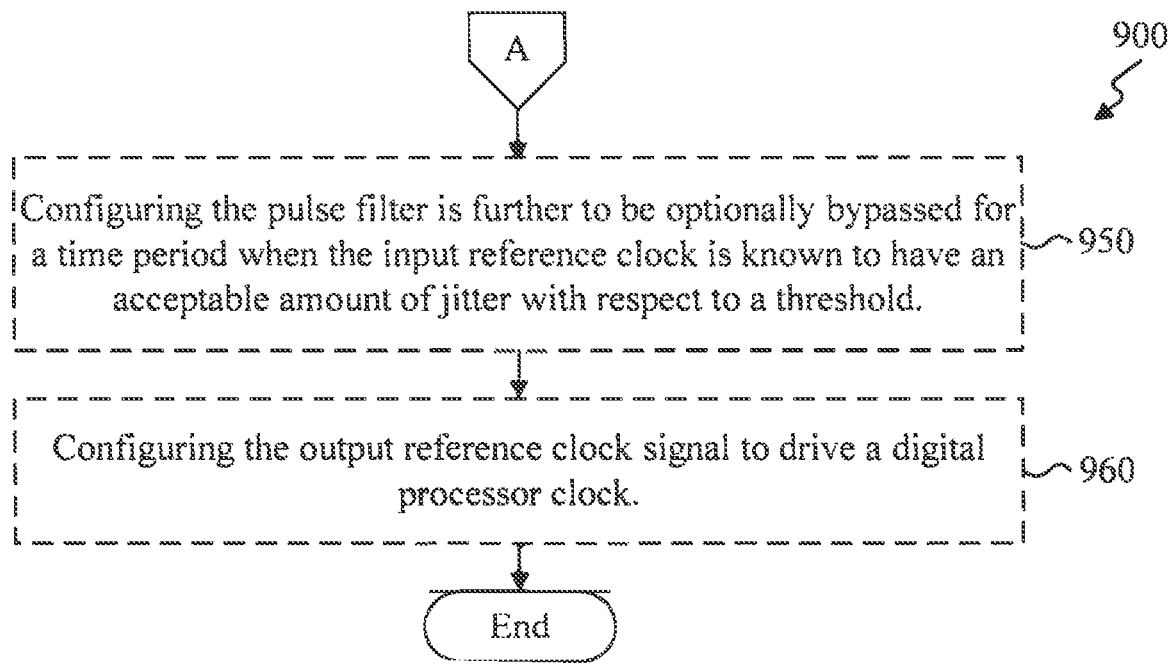

Referring to FIGS. 9-10, further example steps of the method of 800 of FIG. 8 are shown, in accordance with an exemplary aspect.

At block 910, the method 800 includes configuring the pulse filter 221 to skip the one or more of the clock cycles 291 output from the MDLL 210.

At block 920, the method 800 includes configuring the MDLL 210 to have a clock multiplying factor of X, and configuring the pulse filter 221 to skip every X number of output cycles from the MDLL 210, wherein X is an integer greater than or equal to one.

At block 930, the method 800 includes synchronizing each of the X number of output cycles 291 from the MDLL 210 that is skipped by the pulse filter with an edge of the input reference clock B_CLK.

At block 940, the method 800 includes configuring the MDLL 210 to include a frequency multiplier circuit 211 for generating a multiplied input reference clock signal 291 at one or more frequency multiples greater than a frequency of the input reference clock signal B_CLK.

In an aspect, block 940 may include block 940A.

At block 940A, the method 800 includes configuring the pulse filter 221 to be comprised in or connected to a frequency divider circuit 220 that, in turn, is configured to divide a frequency of the multiplied input reference clock signal 291 by a dividing factor C, D after pulse filtering of the multiplied input reference clock signal 291.

At block 950, the method 800 includes configuring the pulse filter 221 is further to be optionally bypassed for a time period when the input reference clock B_CLK is known to have an acceptable amount of jitter with respect to a threshold.

At block 960, the method 800 includes configuring the output reference clock signal DIG_CLK to drive a digital processor 320.

Aspects of the present disclosure include one or any combination of the following clauses.

Clause 1. A clock generation system comprising: a pulse filter configured to receive an input reference clock signal and a multiplied input reference clock signal and filter the multiplied input reference clock signal to generate an output reference clock signal with reduced negative period jitter with respect to the input reference clock signal by selectively skipping clock cycles of the multiplied input reference clock signal corresponding to input reference clock signal edges.

Clause 2. The clock generation system in accordance with clause 1, wherein the pulse filter is configured to skip every X number of the clock cycles of the multiplied input reference clock signal, and wherein X is an integer greater than or equal to one.

Clause 3. The clock generation system in accordance with any preceding clauses, wherein input clock edges of the clock cycles of the multiplied input reference clock signal that are skipped are detected as early edges that result in a shorter than expected clock cycle time.

Clause 4. The clock generation system in accordance with any preceding clauses, wherein the pulse filter is further configured to be optionally bypassed when the amount of the jitter in the input reference clock signal is acceptable with respect to a threshold.

Clause 5. The clock generation system in accordance with any preceding clauses, wherein the output reference clock signal is used to drive a digital processor clock.

Clause 6. The clock generation system in accordance with any preceding clauses, wherein the jitter is periodic and occurs at a known frequency at which the selective skipping of the clock cycles of the multiplied input reference clock signal is performed.

Clause 7. The clock generation system in accordance with any preceding clauses, wherein the known frequency at which the jitter occurs is synchronized with every X number of the clock cycles of the multiplied input reference clock signal, wherein X is an integer greater than or equal to one.

Clause 8. The clock generation system in accordance with any preceding clauses, further comprising a frequency divider circuit configured to divide a frequency of the multiplied input reference clock signal by a dividing factor after pulse filtering of the multiplied input reference clock signal by the pulse filter.

Clause 9. A reference clock circuit comprising: a multiplying delay locked loop (MDLL) configured to generate a multiplied reference clock signal based on an input reference clock signal; and a pulse filter configured to receive the input reference clock signal and the multiplied input reference clock signal and filter the multiplied input reference clock signal to generate an output reference clock signal with reduced negative period jitter with respect to the input reference clock signal by selectively skipping clock cycles of the multiplied input reference clock signal corresponding to input reference clock signal edges.

Clause 10. The reference clock circuit in accordance with clause 9, wherein the pulse filter is configured to skip the one or more of the clock cycles output from the MDLL.

Clause 11. The reference clock circuit in accordance with any preceding clauses, wherein the MDLL has a clock multiplying factor of X, wherein every X number of output cycles from the MDLL is skipped by the pulse filter, and wherein X is an integer greater than or equal to one.

Clause 12. The reference clock circuit in accordance with any preceding clauses, wherein each of the X number of output cycles from the MDLL that is skipped by the pulse filter is synchronized with an edge of the input reference clock.

Clause 13. The reference clock circuit in accordance with any preceding clauses, wherein the pulse filter is further configured to be optionally bypassed for a time period when the input reference clock is known to have an acceptable amount of jitter with respect to a threshold.

Clause 14. The reference clock circuit in accordance with any preceding clauses, wherein the output reference clock signal is used to drive a digital processor clock.

Clause 15. The reference clock circuit in accordance with any preceding clauses, wherein the MDLL comprises a frequency multiplier circuit configured to generate a multiplied input reference clock signal at one or more frequency multiples greater than a frequency of the input reference clock signal.

Clause 16. The reference clock circuit in accordance with any preceding clauses, further comprising a frequency divider circuit configured to divide a frequency of the multiplied input reference clock signal by a dividing factor after pulse filtering of the multiplied input reference clock signal by the pulse filter.

Clause 17. A method for clock generation comprising: receiving, at a pulse filter, an input reference clock signal and a multiplied input reference clock signal; and filtering, by the pulse filter, the multiplied input reference clock signal to generate an output reference clock signal with reduced negative period jitter with respect to the input reference clock signal by selectively skipping clock cycles of the multiplied input reference clock signal corresponding to input reference clock signal edges.

Clause 18. The method for clock generation in accordance with clause 17, wherein selectively skipping comprises configuring the pulse filter to skip every X number of the clock cycles of the multiplied input reference clock signal, wherein X is an integer greater than or equal to one.

Clause 19. The method for clock generation in accordance with any preceding clauses, further comprising detecting input clock edges of the clock cycles of the multiplied input reference clock signal that are skipped as early edges that result in a shorter than expected cycle time.

Clause 20. The method for clock generation in accordance with any preceding clauses, further comprising bypassing the pulse filter when an amount of the jitter in the input reference clock signal is acceptable with respect to a threshold.

Clause 21. The method for clock generation in accordance with any preceding clauses, further comprising driving a digital processor clock using the output reference clock signal.

Clause 22. The method for clock generation in accordance with any preceding clauses, wherein the jitter is periodic and occurs at a known frequency at which the selective skipping of the clock cycles of the multiplied input reference clock signal is performed.

Clause 23. The method for clock generation in accordance with any preceding clauses, wherein the known frequency at which the jitter occurs is synchronized with every X number of the clock cycles of the multiplied input reference clock signal, wherein X is an integer greater than or equal to one.

Various aspects of the disclosure may take the form of an entirely or partially hardware aspect, an entirely or partially software aspect, or a combination of software and hardware. Furthermore, as described herein, various aspects of the disclosure (e.g., systems and methods) may take the form of a computer program product comprising a computer-readable non-transitory storage medium having computer-accessible instructions (e.g., computer-readable and/or computer-executable instructions) such as computer software, encoded or otherwise embodied in such storage medium. Those instructions can be read or otherwise accessed and executed by one or more processors to perform or permit the performance of the operations described herein. The instructions can be provided in any suitable form, such as source code, compiled code, interpreted code, executable code, static code, dynamic code, assembler code, combinations of the foregoing, and the like. Any suitable computer-readable non-transitory storage medium may be utilized to form the computer program product. For instance, the computer-readable medium may include any tangible non-transitory medium for storing information in a form readable or otherwise accessible by one or more computers or processor(s) functionally coupled thereto. Non-transitory storage media can include read-only memory (ROM); random access memory (RAM); magnetic disk storage media; optical storage media; flash memory, and so forth.

Aspects of this disclosure are described herein with reference to block diagrams and flowchart illustrations of methods, systems, apparatuses, and computer program products. It can be understood that each block of the block diagrams and flowchart illustrations, and combinations of blocks in the block diagrams and flowchart illustrations, respectively, can be implemented by computer-accessible instructions. In certain implementations, the computer-accessible instructions may be loaded or otherwise incorporated into a general-purpose computer, a special-purpose computer, or another programmable information processing apparatus to produce a particular machine, such that the operations or functions specified in the flowchart block or blocks can be implemented in response to execution at the computer or processing apparatus.

Unless otherwise expressly stated, it is in no way intended that any device protocol, procedure, process, or method set forth herein be construed as requiring that its acts or steps be performed in a specific order. Accordingly, where a process or method claim does not actually recite an order to be followed by its acts or steps, or it is not otherwise specifically recited in the claims or descriptions of the subject disclosure that the steps are to be limited to a specific order, it is in no way intended that an order be inferred, in any respect. This holds for any possible non-express basis for interpretation, including: matters of logic with respect to the arrangement of steps or operational flow; plain meaning derived from grammatical organization or punctuation; the number or type of aspects described in the specification or annexed drawings; or the like.

As used in this disclosure, including the annexed drawings, the terms "component," "module," "system," and the like are intended to refer to a computer-related entity or an entity related to an apparatus with one or more specific functionalities. The entity can be either hardware, a combination of hardware and software, software, or software in execution. One or more of such entities are also referred to as "functional elements." As an example, a component can be a process running on a processor, a processor, an object, an executable, a thread of execution, a program, and/or a computer. For example, both an application running on a server or network controller, and the server or network controller can be a component. One or more components can reside within a process and/or thread of execution and a component can be localized on one computer and/or distributed between two or more computers. Also, these components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which parts can be controlled or otherwise operated by program code executed by a processor. As yet another example, a component can be an apparatus that provides specific functionality through electronic components without mechanical parts, the electronic components can include a processor to execute program code that provides, at least partially, the functionality of the electronic components. As still another example, interface(s) can include I/O components or Application Programming Interface (API) components. While the foregoing examples are directed to aspects of a component, the exemplified aspects or features also apply to a system, module, and similar.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should be construed to mean "one or more" unless specified otherwise or clear from context to be directed to a singular form.

In addition, the terms "example" and "such as" and "e.g." are utilized herein to mean serving as an instance or illustration. Any aspect or design described herein as an "example" or referred to in connection with a "such as" clause or "e.g." is not necessarily to be construed as preferred or advantageous over other aspects or designs described herein. Rather, use of the terms "example" or "such as" or "e.g." is intended to present concepts in a concrete fashion. The terms "first," "second," "third," and so forth, as used in the claims and description, unless otherwise clear by context, is for clarity only and does not necessarily indicate or imply any order in time or space.

The term "processor," as utilized in this disclosure, can refer to any computing processing unit or device comprising processing circuitry that can operate on data and/or signaling. A computing processing unit or device can include, for example, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can include an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. In some cases, processors can exploit nano-scale architectures, such as molecular and quantum-dot based transistors, switches and gates, in order to optimize space usage or enhance performance of user equipment. A processor may also be implemented as a combination of computing processing units.

In addition, terms such as "store," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory. Moreover, a memory component can be removable or affixed to a functional element (e.g., device, server).

Simply as an illustration, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components or systems or methods herein are intended to comprise, without being limited to comprising, these and any other suitable types of memory.

Various aspects described herein can be implemented as a method, apparatus, or article of manufacture using special programming as described herein. In addition, various of the aspects disclosed herein also can be implemented by means of program modules or other types of computer program instructions specially configured as described herein and stored in a memory device and executed individually or in combination by one or more processors, or other combination of hardware and software, or hardware and firmware. Such specially configured program modules or computer program instructions, as described herein, can be loaded onto a general-purpose computer, a special-purpose computer, or another type of programmable data processing apparatus to produce a machine, such that the instructions which execute on the computer or other programmable data processing apparatus create a means for implementing the functionality of disclosed herein.

The term "article of manufacture" as used herein is intended to encompass a computer program accessible from any non-transitory computer-readable device, carrier, or media. For example, computer readable media can include but are not limited to magnetic storage devices (e.g., hard drive disk, floppy disk, magnetic strips, or similar), optical discs (e.g., compact disc (CD), digital versatile disc (DVD), blu-ray disc (BD), or similar), smart cards, and flash memory devices (e.g., card, stick, key drive, or similar).

The detailed description set forth herein in connection with the annexed figures is intended as a description of various configurations or implementations and is not intended to represent the only configurations or implementations in which the concepts described herein may be practiced. The detailed description includes specific details for the purpose of providing a thorough understanding of various concepts. However, it will be apparent to those skilled in the art that these concepts may be practiced without these specific details or with variations of these specific details. In some instances, well-known components are shown in block diagram form, while some blocks may be representative of one or more well-known components.

The previous description of the disclosure is provided to enable a person skilled in the art to make or use the disclosure. Various modifications to the disclosure will be readily apparent to those skilled in the art, and the common principles defined herein may be applied to other variations without departing from the scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A reference clock generation system comprising:
a pulse filter configured to receive an input reference clock signal and a multiplied input reference clock signal and filter the multiplied input reference clock signal to generate an output reference clock signal with reduced negative period jitter with respect to the input reference clock signal by selectively skipping clock cycles of the multiplied input reference clock signal corresponding to input reference clock signal edges.

2. The clock generation system in accordance with claim 1, wherein the pulse filter is configured to skip every X number of the clock cycles of the multiplied input reference clock signal, and wherein X is an integer greater than or equal to one.

3. The clock generation system in accordance with claim 1, wherein input clock edges of the clock cycles of the multiplied input reference clock signal that are skipped are detected as early edges that result in a shorter than expected clock cycle time.

4. The clock generation system in accordance with claim 1, wherein the pulse filter is further configured to be optionally bypassed when an amount of the jitter in the input reference clock signal is acceptable with respect to a threshold.

5. The clock generation system in accordance with claim 1, wherein the output reference clock signal is used to drive a digital processor clock.

6. The clock generation system in accordance with claim 1, wherein the jitter is periodic and occurs at a known frequency at which the selective skipping of the clock cycles of the multiplied input reference clock signal is performed.

7. The clock generation system in accordance with claim 6, wherein the known frequency at which the jitter occurs is synchronized with every X number of the clock cycles of the multiplied input reference clock signal, wherein X is an integer greater than or equal to one.

8. The clock generation system in accordance with claim 1, further comprising a frequency divider circuit configured to divide a frequency of the multiplied input reference clock signal by a dividing factor after pulse filtering of the multiplied input reference clock signal by the pulse filter.

9. A reference clock circuit comprising:
a multiplying delay locked loop (MDLL) configured to generate a multiplied reference clock signal based on an input reference clock signal; and
a pulse filter configured to receive the input reference clock signal and the multiplied input reference clock signal and filter the multiplied input reference clock signal to generate an output reference clock signal with reduced negative period jitter with respect to the input reference clock signal by selectively skipping clock cycles of the multiplied input reference clock signal corresponding to input reference clock signal edges.

10. The reference clock circuit in accordance with claim 9, wherein the pulse filter is configured to skip the one or more of the clock cycles output from the MDLL.

11. The reference clock circuit in accordance with claim 9, wherein the MDLL has a clock multiplying factor of X, wherein every X number of output cycles from the MDLL is skipped by the pulse filter, and wherein X is an integer greater than or equal to one.

12. The reference clock circuit in accordance with claim 11, wherein each of the X number of output cycles from the MDLL that is skipped by the pulse filter is synchronized with an edge of the input reference clock.

13. The reference clock circuit in accordance with claim 9, wherein the pulse filter is further configured to be optionally bypassed for a time period when the input reference clock is known to have an acceptable amount of jitter with respect to a threshold.

14. The reference clock circuit in accordance with claim 9, wherein the output reference clock signal is used to drive a digital processor clock.

15. The reference clock circuit in accordance with claim 9, wherein the MDLL comprises a frequency multiplier circuit configured to generate a multiplied input reference clock signal at one or more frequency multiples greater than a frequency of the input reference clock signal.

16. The reference clock circuit in accordance with claim 15, further comprising a frequency divider circuit configured to divide a frequency of the multiplied input reference clock signal by a dividing factor after pulse filtering of the multiplied input reference clock signal by the pulse filter.

17. A method for reference clock generation comprising:
receiving, at a pulse filter, an input reference clock signal and a multiplied input reference clock signal;
filtering, by the pulse filter, the multiplied input reference clock signal to generate an output reference clock signal with reduced negative period jitter with respect to the input reference clock signal by selectively skipping clock cycles of the multiplied input reference clock signal corresponding to input reference clock signal edges.

18. The method for clock generation in accordance with claim 17, wherein selectively skipping comprises configuring the pulse filter to skip every X number of the clock cycles of the multiplied input reference clock signal, wherein X is an integer greater than or equal to one.

19. The method for clock generation in accordance with claim 17, further comprising detecting input clock edges of the clock cycles of the multiplied input reference clock signal that are skipped as early edges that result in a shorter than expected cycle time.

20. The method for clock generation in accordance with claim 17, further comprising bypassing the pulse filter when an amount of the jitter in the input reference clock signal is acceptable with respect to a threshold.

21. The method for clock generation in accordance with claim 17, further comprising driving a digital processor clock using the output reference clock signal.

22. The method for clock generation in accordance with claim 17, wherein the jitter is periodic and occurs at a known frequency at which the selective skipping of the clock cycles of the multiplied input reference clock signal is performed.

23. The method for clock generation in accordance with claim 22, further comprising synchronizing the known frequency at which the jitter occurs with every X number of the clock cycles of the multiplied input reference clock signal, wherein X is an integer greater than or equal to one.

* * * * *